United States Patent
Takeuchi et al.

(10) Patent No.: US 6,654,397 B2
(45) Date of Patent: Nov. 25, 2003

(54) SEMICONDUCTOR LASER DEVICE AND MANUFACTURING METHOD THEREOF

(75) Inventors: Kunio Takeuchi, Jyoyo (JP); Ryoji Hiroyama, Kyotanabe (JP); Shigeyuki Okamoto, Kobe (JP); Koji Tominaga, Hirakata (JP); Yasuhiko Nomura, Moriguchi (JP); Daijiro Inoue, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 286 days.

(21) Appl. No.: 09/941,663

(22) Filed: Aug. 30, 2001

(65) Prior Publication Data

US 2002/0024985 A1 Feb. 28, 2002

(30) Foreign Application Priority Data

Aug. 31, 2000 (JP) ............................. 2000-264405

(51) Int. Cl.[7] .............................. H01S 5/00; H01S 3/04
(52) U.S. Cl. ........................................... 372/46; 372/36
(58) Field of Search ............................. 372/45, 46, 49, 372/36; 438/22

(56) References Cited

U.S. PATENT DOCUMENTS

| | | | | |
|---|---|---|---|---|
| 5,343,486 A | * | 8/1994 | Itaya et al. | 372/43 |
| 5,737,351 A | * | 4/1998 | Ono | 372/45 |
| 5,894,491 A | * | 4/1999 | Sawano et al. | 372/49 |
| 6,373,875 B1 | * | 4/2002 | Yu et al. | 372/46 |

FOREIGN PATENT DOCUMENTS

| | | |
|---|---|---|
| JP | 5-114763 | 5/1993 |
| JP | 11-251679 | 9/1999 |

OTHER PUBLICATIONS

R. Hiroyama et al.; Electronic Letters, vol. 33, No.12, pp. 1084–1086, Jun. 1997. (Discussed in the specification).

S. Arimoto et al.; IEEE Journal of Quantum Electronics, vol. 29, No. 6, pp. 1874–1979, Jun. 1993. (Discussed in the specification).

* cited by examiner

Primary Examiner—Quyen Leung
(74) Attorney, Agent, or Firm—Armstrong, Westerman & Hattori, LLP

(57) ABSTRACT

An n-GaAs current blocking layer is formed on a p-AlGaInP first cladding layer, on sides of a ridge portion and in a region on the upper surface of the ridge portion above a window region. Raised portions are formed in a p-GaAs cap layer in regions in the vicinity of facets, while raised regions are formed in the regions of a first electrode in the vicinity of the facets. A second electrode having a thickness larger than the height of the raised regions is formed on the region between the raised regions of the first electrode.

20 Claims, 8 Drawing Sheets

SEMICONDUCTOR LASER DEVICE AND MANUFACTURING METHOD THEREOF

BACKGROUND OF THE INVENTION

1. Field of the Invention

The present invention relates to a semiconductor laser device mounted on a heat sink and a manufacturing method thereof.

2. Description of the Background Art

A high power semiconductor laser device is indispensable as a light source for a recordable optical disc system and must have high reliability. One of the reasons why increase in the power of the semiconductor laser device has been restricted is COD (Catastrophic Optical Damage). The COD is believed to occur in the following cycle.

When current is injected to a facet of a cavity having a surface state in a high density, non-radiative recombination is caused through the surface state, and heat is generated. The generated heat reduces the energy gap at the facet portion, so that light is absorbed, which increases the heat generation. As this cycle is repeated, the temperature at the facet increases, and the crystal melts.

As a method of restricting the COD, the use of a current blocking region near the facet and a window structure by Zn diffusion are disclosed in ELECTRONICS LETTERS, Vol. 33, No. 12, pp. 1084–1086, 1997 and IEEE JOURNAL OF QUANTUM ELECTRONICS, Vol. 29, No. 6, pp. 1874–1879, 1993.

FIG. 10 is a partly cut away, perspective view of a conventional semiconductor laser device having a current blocking region near the facet. FIG. 11 is a partly cut away, perspective view of a conventional semiconductor laser device having a window structure.

In FIGS. 10 and 11, an n-GaInP buffer layer 32, an n-AlGaInP cladding layer 33, a quantum well active layer 34 and a p-AlGaInP first cladding layer 35 are formed in this order on an n-GaAs substrate 31.

In a stripe-shaped region on the p-AlGaIn first cladding layer 35, a p-AlGaInP second cladding layer 36 and a p-GaInP contact layer 37 are formed in this order. These p-AlGaInP second cladding layer 36 and p-GaInP contact layer 37 form a ridge portion R.

An n-GaAs current blocking layer 38 is formed on the p-AlGaInP first cladding layer 35 and both sides of the ridge portion R. The n-GaAs current blocking layer 38 is also formed on regions at the upper surface of the ridge portion R in the vicinity of both facets.

A p-GaAs cap layer 39 is formed on the n-GaAs current blocking layer 38 and the ridge portion R.

Thus, a laser structure 60 of the plurality of layers 32 to 39 is formed on the n-GaAs substrate 31. On the back surface of the n-GaAs substrate 31, an n-electrode 42 is formed. On the upper surface of the laser structure 60, a p electrode (not shown) is formed.

As described above, since the n-GaAs current blocking layer 38 is formed in the regions at the upper surface of the ridge portion R in the vicinity of the facets of the cavity, current is not injected into the regions in the vicinity of the facets. Therefore, the COD is restrained.

Particularly in the semiconductor laser device in FIG. 11, a Zn diffusion region 43 by Zn diffusion is provided in the region in the vicinity of a facet of the quantum well active layer 34. Thus, a window structure allowing a wide band gap is formed in the region of the quantum well active layer 34 in the vicinity of a facet. As a result, there is no light absorption in the vicinity of the facet, and the COD is more restrained.

FIG. 12 is a schematic perspective overview of a conventional high power semiconductor laser device having the laser structure in FIG. 10 or 11. FIG. 13 is a schematic plan view of the semiconductor laser device in FIG. 12. FIG. 14 is a schematic sectional view of the semiconductor laser device in FIG. 12 taken along the length of the cavity.

In the laser structure 60 shown in FIGS. 10 and 11, the n-GaAs current blocking layer 38 is formed only in the regions in the vicinity of the facets on the upper surface of the ridge portion R, and raised portions 50 are formed at the p-GaAs cap layer 39 in the regions in the vicinity of the facets.

Furthermore, as shown in FIGS. 12 to 14, a p-electrode 41 is formed on the upper surface of the semiconductor laser structure 60. Raised regions 51 are formed at the p-electrode 41 because of the raised portions 50. The emitting point 53 of a laser beam is positioned at a facet of the quantum well active layer 34 under the raised portion 50 and the raised region 51.

FIG. 15 is a schematic sectional view of the semiconductor laser device in FIG. 12 provided on a sub-mount taken along the length of a cavity. FIG. 16 is a schematic front view of the semiconductor laser device in FIG. 12 provided on a sub-mount.

As shown in FIGS. 15 and 16, when the semiconductor laser device 300 is mounted junction down on the upper surface of the sub-mount 400 as the p-electrode 41 faces downward, only the raised portions 51 of the p-electrode 41 are in contact with the upper surface of the sub-mount 400. Therefore, at the time of die-bonding or wire-bonding, great stress is locally applied to the portions in the vicinity of the facets of the semiconductor laser device 300. Since the area of contact between the p-electrode 41 and the sub-mount 400 is limited, good heat-radiation characteristic does not result and the adhesion intensity is low. The semiconductor laser device 300 could be mounted tilted on the sub-mount 400. As a result, the reliability of the semiconductor laser device 300 is lowered.

SUMMARY OF THE INVENTION

It is an object of the present invention to provide a highly reliable, high power semiconductor laser device having a raised portion on its upper surface and a method of manufacturing thereof.

A semiconductor laser device according to one aspect of the present invention comprises a substrate, a laser structure formed on the substrate and including an active layer forming a cavity, and an electrode layer formed on the laser structure, the laser structure has a raised portion on its upper surface, the electrode layer has a first film thickness of zero or more in a region on the raised portion and a second film thickness larger than the first film thickness in the region excluding the raised portion.

Here, the first thickness may be zero, in other words, an electrode layer does not have to be formed at the raised portion.

In the semiconductor laser device, a laser structure including an active layer is formed on the substrate, and an electrode layer is formed on the laser structure. The electrode layer has a thickness larger than that in the raised portion in the region excluding the raised portion of the laser structure. Therefore, when the semiconductor laser device is mounted junction down on the upper surface of the heat sink as the electrode layer faces downward, the electrode layer is in contact with the heat sink in a large area. As a result, stress is not applied upon a particular part of the semiconductor laser device, but scattered in the whole of the semiconductor laser device and reduced. The contacting area between the electrode layer and the heat sink increases, so that the heat-radiation characteristic is improved, and the adhesion intensity is improved as well. In addition, the semiconductor laser device can be mounted stably almost without being tilted on the heat sink. As a result, the semiconductor laser device has higher reliability.

The second film thickness is preferably at least the sum of the height of the raised portion and the first film thickness. Thus, when the semiconductor laser device is provided on the upper surface of the heat sink as the electrode layer faces downward, the entire upper surface of the electrode layer is in contact with the upper surface of the heat sink. Therefore, stress is not applied upon a particular part of the semiconductor laser device, but sufficiently scattered in the whole of the semiconductor laser device and reduced. The contacting area between the second electrode and the heat sink sufficiently increases, so that the heat-radiation characteristic is more improved, and the adhesion intensity is more improved as well. In addition, the semiconductor laser device can be mounted more stably without being tilted on the heat sink. As a result, the semiconductor laser has even higher reliability.

The electrode layer may include a first electrode formed on the upper surface of the laser structure to cover at least a part of the raised portion and a second electrode formed on the first electrode excluding a raised region formed in the first electrode because of the raised portion.

In this case, the raised region is formed in the first electrode because of the raised portion in the laser structure. Thus, the second electrode is formed in the region excluding the raised region of the first electrode. Thus, when the semiconductor laser device is mounted junction down on the upper surface of the heat sink as the second electrode faces downward, a large area on the upper surface of the second electrode is in contact with the upper surface of the heat sink.

The first electrode and the second electrode may be formed of different materials or the same material.

The laser structure may include a cladding layer of a first conductivity type, an active layer, and a cladding layer of a second conductivity type in this order, the cladding layer of the second conductivity type may have a flat portion, and a ridge portion formed in a striped region on the flat portion, the laser structure may further include a current blocking layer of the first conductivity type formed on the flat portion on both sides of the ridge portion, on sides of the ridge portion and in a region on the upper surface of the ridge portion on the side of a facet of the cavity, and the raised portion may be formed because of a part of the current blocking layer formed in the region on the upper surface of the ridge portion on the facet side.

In this case, the current blocking layer of the first conductivity type is formed on the flat portion on both sides of the ridge portion, on sides of the ridge portion and in a region on the upper surface of the ridge portion on the side of a facet of the cavity, and therefore current injected from the electrode layer is injected to the ridge portion excluding the region on the side of a facet of the cavity.

Thus, since current is not injected to the region in the vicinity of the facet of the cavity, the COD is restrained. As a result, a high power semiconductor laser device is formed.

The raised portion may include a pair of raised parts formed on the sides of both facets of the cavity.

The active layer may have a quantum well structure, and the region of the active layer on the side of a facet of the cavity may have a band gap larger than in the other region of the active layer.

In this case, a window structure having a large band gap is formed in the region of the active layer in the vicinity of the facet. As a result, there is no light absorption in the vicinity of the facet of the cavity, so that the COD is more restrained. Therefore, a higher output semiconductor laser device is formed.

The region of the active layer on the side of a facet of the cavity may have a band gap larger than in the other region of the active layer because of impurity introduction.

In this case, the quantum well structure is disordered by introducing an impurity in the vicinity of the facet of the active layer, and a window structure having a large band gap is formed. As a result, there is no light absorption in the vicinity of the facet of the cavity, so that the COD is more restrained and a higher power semiconductor laser device is formed.

The active layer may have an ordered structure, a so-called natural super lattice, and the natural super lattice may be disordered by introducing an impurity only to the vicinity of the facet of the active layer to form a window structure.

The semiconductor laser device may further include a heat sink mounted on the electrode layer. In this case, the semiconductor laser device is securely mounted junction down on the upper surface of the heat sink as the electrode layer faces downward.

The electrode layer may have a first film thickness larger than zero in a region on the raised portion and a second film thickness larger than the first film thickness in the region excluding the raised portion. In this case, a relatively thin electrode layer is formed on the raised portion, and a relatively thick electrode layer is formed on the region excluding the raised portion.

The electrode layer may have a first film thickness of zero in the region on the raised portion, and a second thickness larger than zero in the region excluding the raised portion. In this case, no electrode layer is formed on the raised portion and an electrode layer is formed on the region excluding the raised portion.

A method of manufacturing a semiconductor laser device according to another aspect of the present invention comprises the steps of forming on a substrate a laser structure including an active layer forming a cavity and a raised portion on an upper surface of the laser structure, and forming on the laser structure an electrode layer having a first film thickness of zero or more in a region on the raised portion and a second film thickness larger than the first film thickness in the region excluding the raised portion.

Here, the first film thickness may be zero, in other words, an electrode layer does not have to be formed in the raised portion.

According to the method of manufacturing a semiconductor laser device, a laser structure including an active layer is formed on the substrate, and an electrode layer is formed on the laser structure. The electrode layer has a thickness larger in the region excluding the raised portion of the laser structure than in the region on the raised portion. Thus, when the semiconductor laser device is mounted junction down on the upper surface of the heat sink as the electrode layer faces downward, the electrode layer is in contact with the heat sink in a large area. As a result, stress is not applied upon a particular part of the semiconductor laser device, but scattered in the whole of the semiconductor laser device and reduced. The contacting area between the electrode layer and the heat sink increases, so that the heat-radiation characteristic is improved, and the adhesion intensity is improved as well. In addition, the semiconductor laser device can be mounted stably almost without being tilted on the heat sink. As a result, the semiconductor laser device has higher reliability.

The second film thickness is preferably at least the sum of the height of the raised portion and the first film thickness. Thus, when the semiconductor laser device is mounted junction down on the upper surface of the heat sink as the electrode layer faces downward, the entire upper surface of the electrode layer is in contact with the upper surface of the heat sink. As a result, stress is not applied upon a particular part of the semiconductor laser device, but sufficiently scattered in the whole of the semiconductor laser device and reduced. The contacting area between the electrode layer and the heat sink sufficiently increases, so that the heat-radiation characteristic is more improved, and the adhesion intensity is more improved as well. In addition, the semiconductor laser device can be mounted stably without being tilted on the heat sink. As a result, the semiconductor laser device has higher reliability.

The step of forming the electrode layer may include the steps of forming a first electrode to cover at least a part of the raised portion on the upper surface of the laser structure, and forming a second electrode on the first electrode excluding a raised region formed in the first electrode because of the raised portion.

In this case, the raised region is formed in the first electrode because of the raised portion of the laser structure. Thus, the second electrode is formed in the region excluding the raised region of the first electrode. As a result, when the semiconductor laser device is mounted junction down on the upper surface of the heat sink as the second electrode faces downward, a large area of the upper surface of the second electrode is in contact with the upper surface of the heat sink.

The step of forming the laser structure may include the steps of forming a cladding layer of a first conductivity type, the active layer, and a cladding layer of a second conductivity type having a flat portion and a ridge portion formed in a striped region on the flat portion and forming a current blocking layer of the first conductivity type on the flat portion on both sides of the ridge portion, on sides of the ridge portion, and in a region on the upper surface of the ridge portion on the facet side of the cavity, and the raised portion may be formed because of a part of the current blocking layer formed in the region on the upper surface of the ridge portion on the side of a facet of the cavity.

In this case, the current blocking layer of the first conductivity type is formed on the flat portion on both sides of the ridge portion, on sides of the ridge portion and in a region on the upper surface of the ridge portion on the side of a facet of the cavity, and therefore current injected from the electrode layer is injected to the ridge portion excluding the region on the side of a facet of the cavity.

Current is thus not injected into the region in the vicinity of the facet of the cavity. Therefore, the COD is restrained. As a result, a high power semiconductor laser device is formed.

The method of manufacturing a semiconductor laser device may further include the step of mounting a heat sink on the electrode layer.

The raised portion may include a pair of raised parts formed on the sides of both facets of the cavity.

The active layer may have a quantum well structure, and the region of the active layer on the side of a facet of the cavity may have a band gap larger than in the other region of the active layer.

In this case, a window structure having a large band gap is formed in a region of the active layer in the vicinity of the facet. Therefore, there is no light absorption in the vicinity of the facet of the cavity. Consequently, a higher power semiconductor laser device is formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
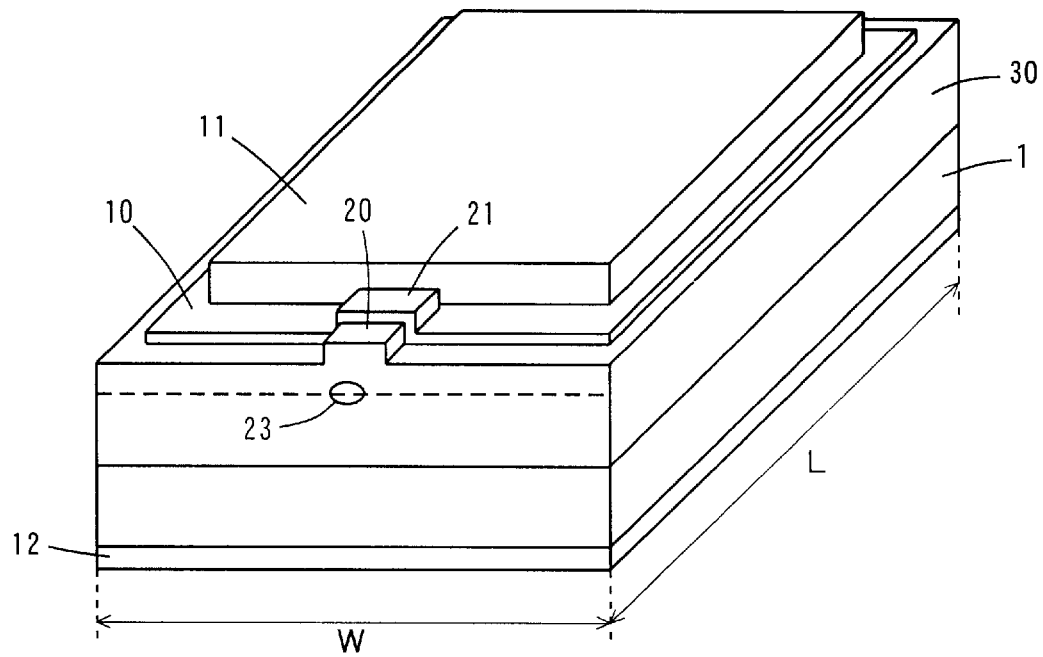
FIG. 1 is a schematic perspective overview of a high power semiconductor laser device according to one embodiment of the present invention.
Figure 2:
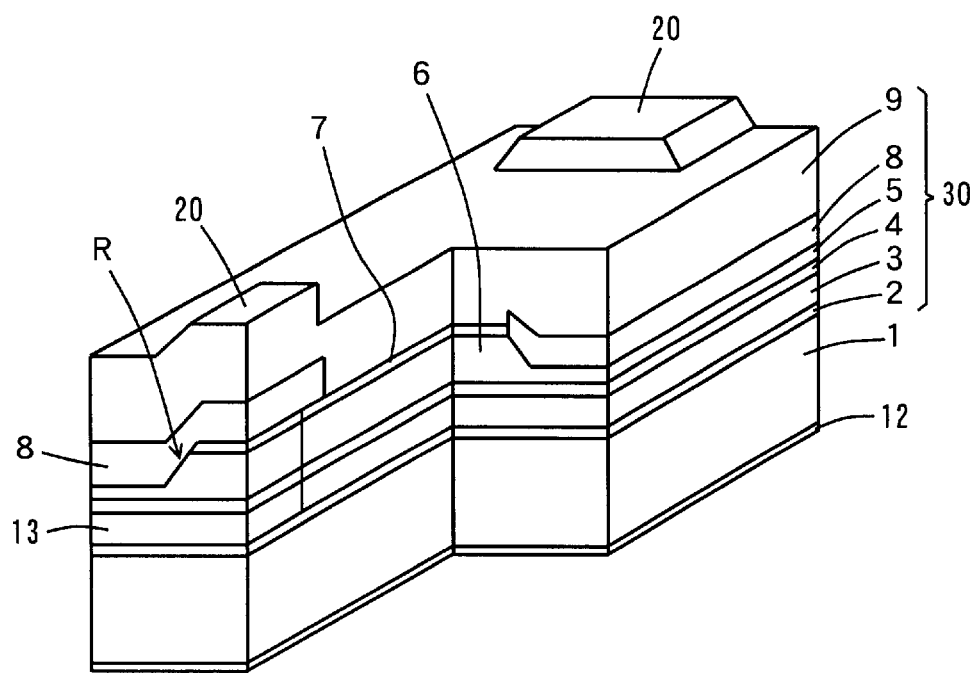
FIG. 2 is a partially cut away, schematic perspective view of the semiconductor laser device in FIG. 1.
Figure 3:
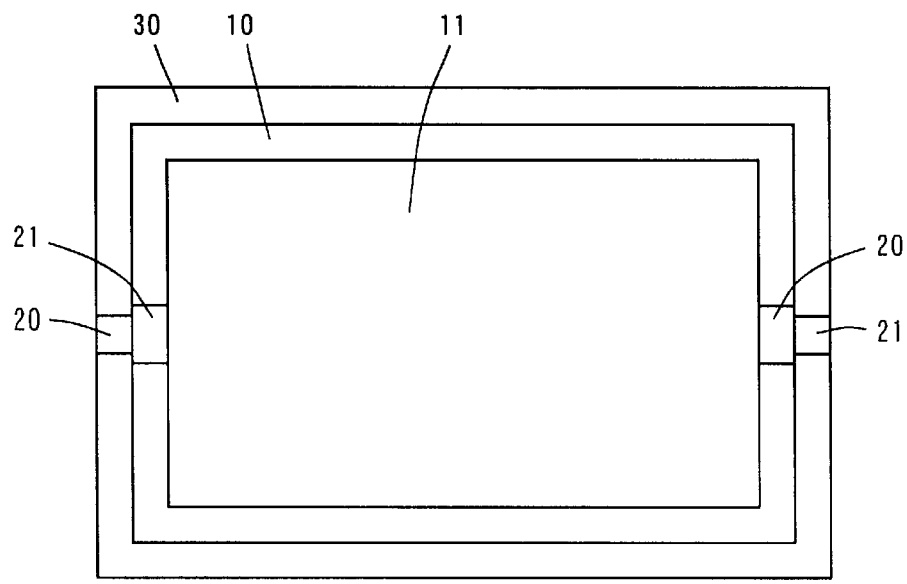
FIG. 3 is a schematic plan view of the semiconductor laser device in FIG. 1.
Figure 4:
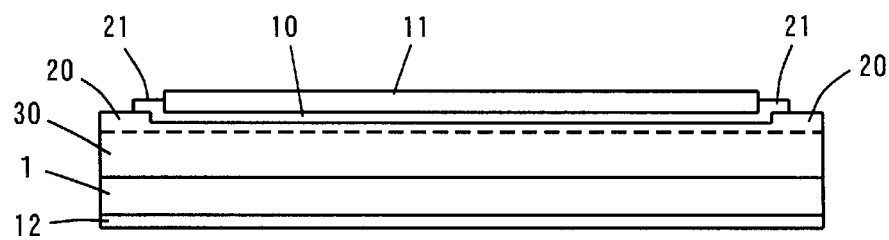
FIG. 4 is a schematic sectional view of the semiconductor laser device in FIG. 1 taken along the length of the cavity.

FIG. 1 is a schematic perspective overview of a high power semiconductor laser device according to one embodiment of the present invention. FIG. 2 is a partially cut away, schematic perspective view of the semiconductor laser device in FIG. 1. FIG. 3 is a schematic plan view of the semiconductor laser device in FIG. 1. FIG. 4 is a schematic sectional view of the semiconductor laser device in FIG. 1 taken along the length of the cavity.

In FIG. 2, a Si-doped, n-GaInP buffer layer 2, a Si-doped, n-AlGaInP cladding layer 3, a quantum well active layer 4, and a Zn-doped, p-AlGaInP first cladding layer 5 are formed in this order on an n-GaAs substrate 1. The Al composition ratio of the n-AlGaInP cladding layer 3 is 0.7, the carrier density is $3\times10^{17}$ cm$^{-3}$, and the film thickness is 2.0 μm. The Al composition ratio of the p-AlGaInP first cladding layer 5 is 0.7, the carrier density is $1\times10^{18}$ cm$^{-3}$, and the film thickness is 0.3 μm.

The quantum well active layer 4 includes an AlGaInP first optical guide layer, a multiple quantum well structure, and an AlGaInP second optical guide layer in this order, and the multiple quantum well structure alternately includes GaInP well layers and AlGaInP barrier layers. The Al composition ratio of the AlGaInP first optical guide layer is 0.5, and the film thickness is 50 nm. The Al composition ratio of the AlGaInP second optical guide layer is 0.5 and the film thickness is 50 nm. The film thickness of each GaInP well layer is 8 nm, the Al composition ratio of each AlGaInP barrier layer is 0.5 and the film thickness is 5 nm.

Note that in order to achieve improved laser characteristic such as reduced threshold current, compressive strain or tensile strain may be introduced into the well layer. A strain compensation structure having strain in the direction opposite to that in the well layer may be employed for a part of the barrier layer or optical guide layer.

A Zn-doped, p-AlGaInP second cladding layer 6 and a Zn-doped, p-GaInP contact layer 7 are formed in this order in a striped region on the p-AlGaInP first cladding layer 5. The Al composition ratio of the p-AlGaInP second cladding layer 6 is 0.7, the carrier density is $1\times10^{18}$ cm$^{-3}$, and the film thickness is 1.2 μm. The carrier density of the p-GaInP contact layer 7 is $1\times10^{18}$ cm$^{-3}$, and the film thickness is 0.1 μm.

These p-AlGaInP second cladding layer 6 and the p-GaInP contact layer 7 form the striped ridge portion R. The width of the lower end of the ridge portion R is 4 μm.

Note that in order to improve the etching controllability at the time of forming the ridge portion R, a GaInP etching stopping layer may be provided between the p-AlGaInP first cladding layer 5 and the p-AlGaInP second cladding layer 6.

In the region in the vicinity of a facet of the quantum well active layer 4, there is a Zn diffusion region 13 having Zn diffused as impurities. In the Zn diffusion region 13, the quantum well structure is disordered, the band gap is expanded compared to the region other than in the vicinity of the facet, and a window structure which does not absorb a laser beam is provided.

As another window structure, the quantum well active layer 4 may have a natural super lattice structure and the natural super lattice may be disordered in the vicinity of the facet.

In order to allow the injected current to pass only across the region of the ridge R, a Se-doped, n-GaAs current blocking layer 8 is formed on the p-AlGaInP first cladding layer 5 and on both sides of the ridge portion R. The n-GaAs current blocking layer 8 is also formed in a region on the upper surface of the ridge portion R above the Zn diffusion region 13 in order to limit the injection of current into the region in the vicinity of the facet of the quantum well active layer 4. The carrier density of the n-GaAs current blocking layer 8 is $1\times10^{18}$ cm$^{-3}$, and the film thickness is 1.2 μm.

A Zn-doped, p-GaAs cap layer 9 is formed on the n-GaAs current blocking layer 8 and the ridge portion R. The carrier density of the p-GaAs cap layer 9 is $1\times10^{19}$ cm$^{-3}$, and the film thickness is 3.0 μm.

Thus, the laser structure 30 of the plurality of layers 2 to 9 is formed on the n-GaAs substrate 1. On the back surface of the n-GaAs substrate 1, an n-electrode 12 is formed.

In this structure, the n-GaAs current blocking layer 9 is formed only in the regions in the vicinity of the facets on the upper surface of the ridge portion R, and therefore raised portions 20 are formed at the p-GaAs cap layer 9 in regions in the vicinity of the facets.

As shown in FIGS. 1, 3 and 4, a first electrode 10 of CrAu is formed on the upper surface of the laser structure 30. Because of the raised portions 20 in the p-GaAs cap layer 9, raised regions 21 are formed in regions of the first electrode 10 in the vicinity of the facets. The first electrode 10 has a thickness of 1.2 μm.

A second electrode 11 of PdAu is formed in the region between raised regions 21 in the first electrode 10. The second electrode 11 has a thickness of 2.5 μm. A material such as CrAu may be used for the second electrode 11.

In FIG. 1, the width W of the laser structure 30 is for example 300 μm, and the cavity length L is for example 900 μm.

Figure 5:
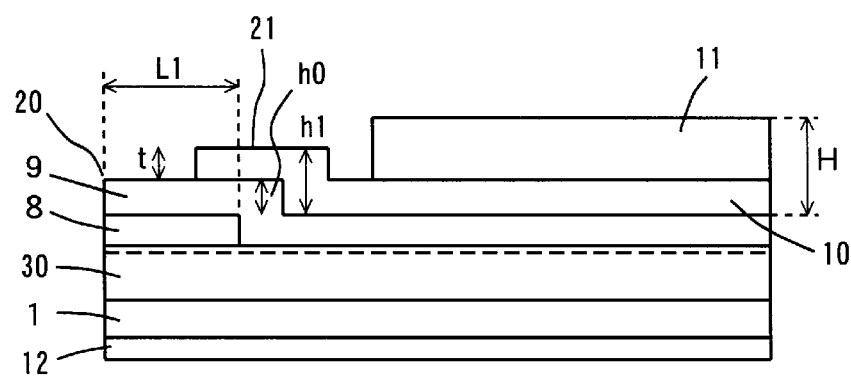
FIG. 5 is an enlarged sectional view of the semiconductor laser device in FIGS. 1 to 4 in the vicinity of a facet.

FIG. 5 is an enlarged sectional view of the semiconductor laser device in FIGS. 1 to 4 in the vicinity of a facet. The height H from the upper surface of the laser structure 30 to the upper surface of the second electrode 11 is set equal to or larger than the sum h1 of the height h0 of the raised portion 20 and the thickness t of the first electrode 10. Here, The height H from the upper surface of the laser structure 30 to the upper surface of the second electrode 11 is the sum of the film thickness of the first electrode 10 and the film thickness of the second electrode 11.

According to the embodiment, the first electrode 10 has a thickness of 1.2 μm, while the second electrode 11 has a thickness of 2.5 μm, and therefore the height H from the upper surface of the laser structure 30 to the upper surface of the second electrode 11 is 3.7 μm. The height h0 of the raised portion 20 is 1.2 μm corresponding to the thickness of the n-GaAs current blocking layer 8, and therefore the sum h1 of the height h0 of the raised portion 20 and the thickness t of the first electrode 10 is 2.4 μm.

Figure 6:
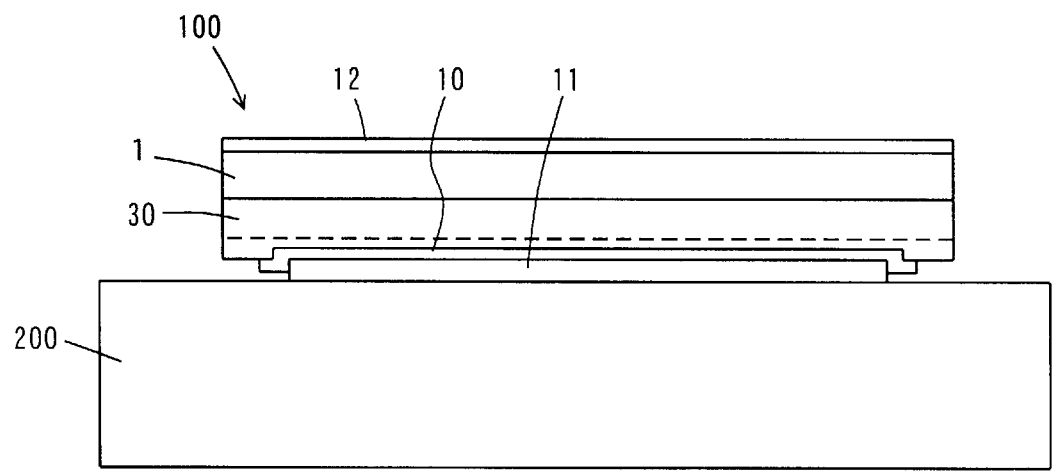
FIG. 6 is a schematic sectional view of the semiconductor laser device in FIG. 1 provided on a sub-mount taken along the length of the cavity.
Figure 7:
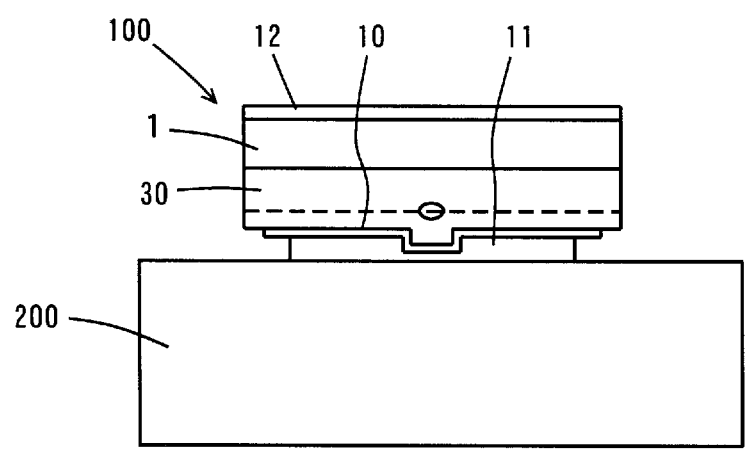
FIG. 7 is a schematic front view of the semiconductor laser device in FIG. 1 provided on the sub-mount.

FIG. 6 is a schematic sectional view of the semiconductor laser device in FIG. 1 provided on a sub-mount taken along the length of the cavity. FIG. 7 is a schematic front view of the semiconductor laser device in FIG. 1 provided on the sub-mount.

The length L1 (see FIG. 5) of the current non-injection portion by the n-GaAs current blocking layer 8 on the ridge portion R is 30 μm.

As shown in FIGS. 6 and 7, when the semiconductor laser device 100 in FIG. 1 is mounted junction down on the upper surface of sub-mount 200 as the second electrode 11 faces downward, the entire upper surface of the second electrode 11 is in contact with the upper surface of the sub-mount 200. Therefore, stress is not applied upon a particular part of the semiconductor laser device 100 but scattered in the whole of the semiconductor laser device 100 and reduced. The contacting area between the second electrode 11 and the sub-mount 200 increases, so that the heat-radiation characteristic is improved, and the adhesion intensity is improved as well.

In addition, the semiconductor laser device 100 can be mounted stably without being tilted on the sub-mount 200. As a result, the semiconductor laser device 100 has higher reliability.

Here, as described above, the electrode layer most preferably comprises of the first electrode 10 and the second electrode 11, while the only the second electrode 11 may be formed without the first electrode 10.

A method of manufacturing the semiconductor laser device shown in FIGS. 1 to 4 will be now described.

The laser structure 30 shown in FIG. 2 is formed by crystal growth such as OMVPE (Organo-Metallic Vapor Phase Epitaxy) on the n-GaAs substrate 1.

Then, by a vapor deposition or photolithography process, the first electrode 10 is formed almost on the entire upper surface of the laser structure 30. The first electrode 10 is also formed on the raised portions 20 on the current non-injection portions of the n-GaAs current blocking layer 8 in the vicinity of both facets.

Then, by a vapor deposition or lift off process, the second electrode 11 is formed in the region between the raised regions 21 of the first electrode 10. In this case, a mask is formed in regions in a prescribed width including the raised regions 21 in the vicinity of both facets, and then the material of the second electrode 11 is vapor-deposited. Thereafter, an unwanted vapor-deposited film is removed with acetone.

Then, the back surface of the n-GaAs substrate 1 is polished by etching, so that the n-GaAs substrate 1 has a thickness of about 100 μm. Then, an n-electrode 12 is formed on the back surface of the n-GaAs substrate 1 by vapor deposition.

Finally, after device separation by scribing, the semiconductor laser device 100 is mounted junction down on the sub-mount 200 as shown in FIGS. 6 and 7.

Note that the second electrode 11 may be plated with gold to have a thickness of about 10 μm.

Figure 8:
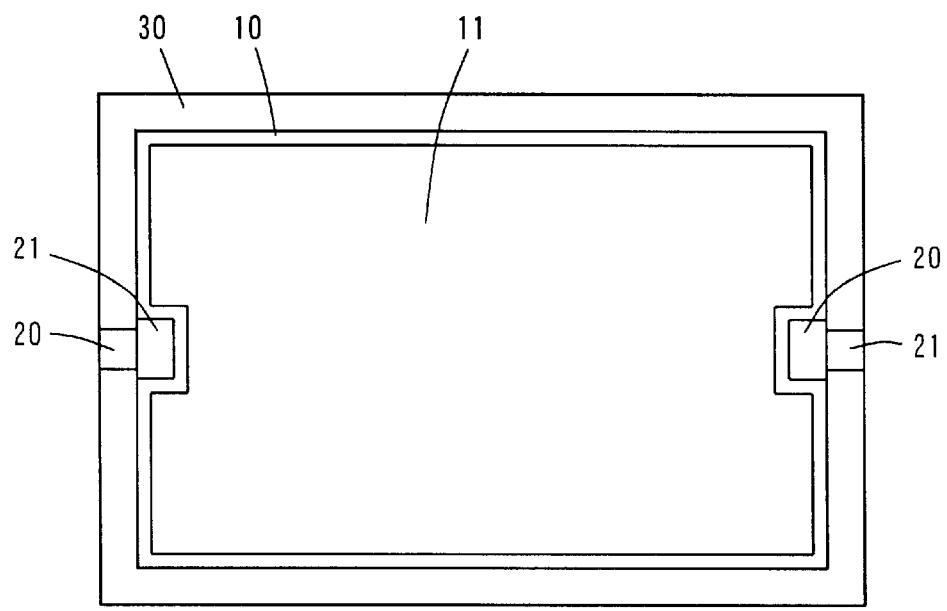
FIG. 8 is a schematic plan view showing another example of a second electrode.

FIG. 8 is a schematic plan view showing another example of the second electrode 11. In the example in FIG. 8, the second electrode 11 is provided to partially surround the raised regions 21 of the first electrode 10. In this case, if the semiconductor laser device 100 is mounted junction down on the upper surface of the sub-mount 200 as the second electrode 11 faces downward, the entire upper surface of the second electrode 11 is in contact with the upper surface of the sub-mount 200.

Note that according to the embodiment, the sum of the film thickness of the first and second electrodes 10 and 11 is 3.7 μm, while the sum is preferably not less than 5 μm. Thus, the semiconductor laser device has higher reliability and improved polarization characteristic. More preferably, the sum of the film thickness of the first and second electrodes 10 and 11 is not less than 10 μm. Thus, the semiconductor laser device has even higher reliability and more improved polarization characteristic.

Also according to the embodiment, the first and second electrodes 10 and 11 are separately formed, while these electrodes may be formed integrally from the same material.

(Inventive Example)

Semiconductor laser devices according to the inventive example and a comparative example were examined for their reliability. The semiconductor laser device according to the inventive example has the structure shown in FIGS. 1 to 4, while the semiconductor laser device according to the comparative example has a structure as shown in FIGS. 11 to 14. The semiconductor laser device according to the comparative example has a structure similar to the inventive example except that the p-electrode 41 is different from the first and second electrodes 10 and 11.

Figure 9:
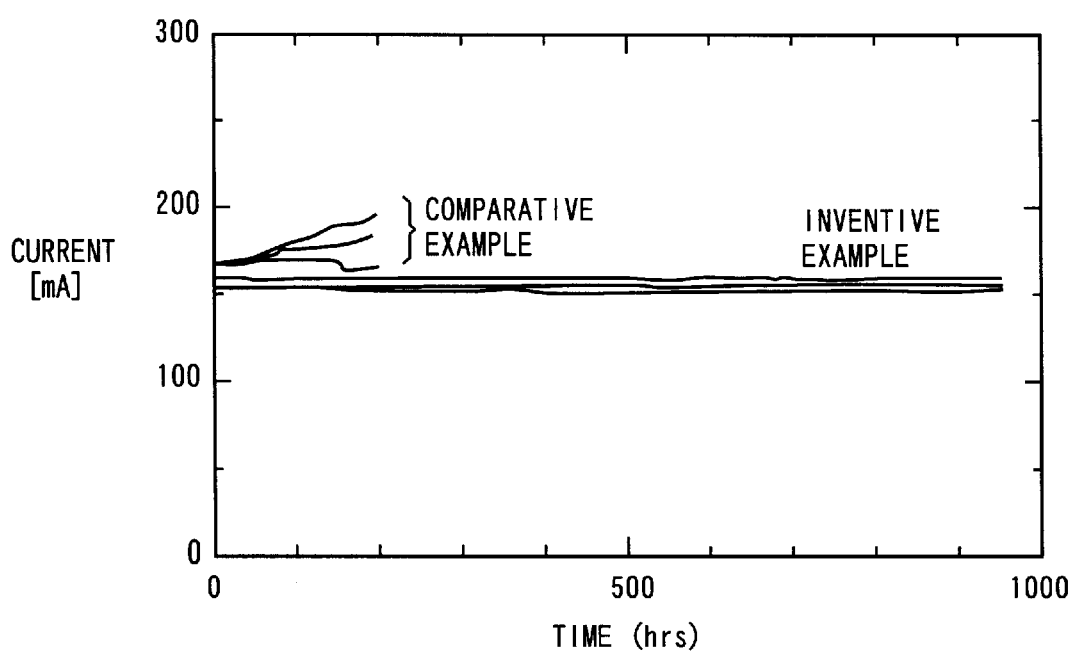
FIG. 9 is a graph representing the result of the life test of the semiconductor laser devices according to the embodiment and a comparison example.
Figure 10:
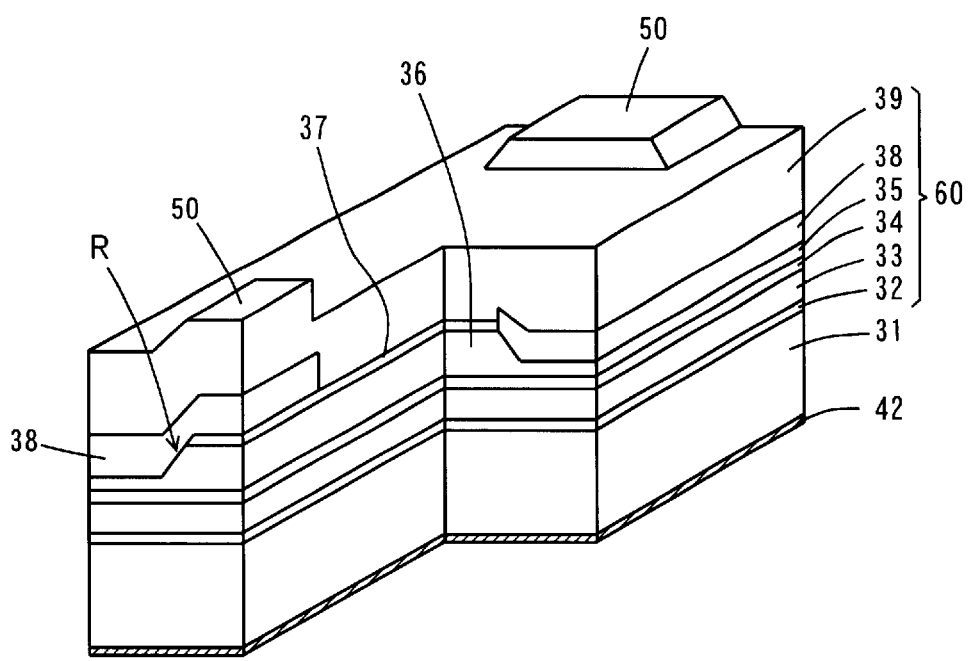
FIG. 10 is a partly cut away, perspective view of a conventional semiconductor laser device having a current blocking region near the facet.
Figure 11:
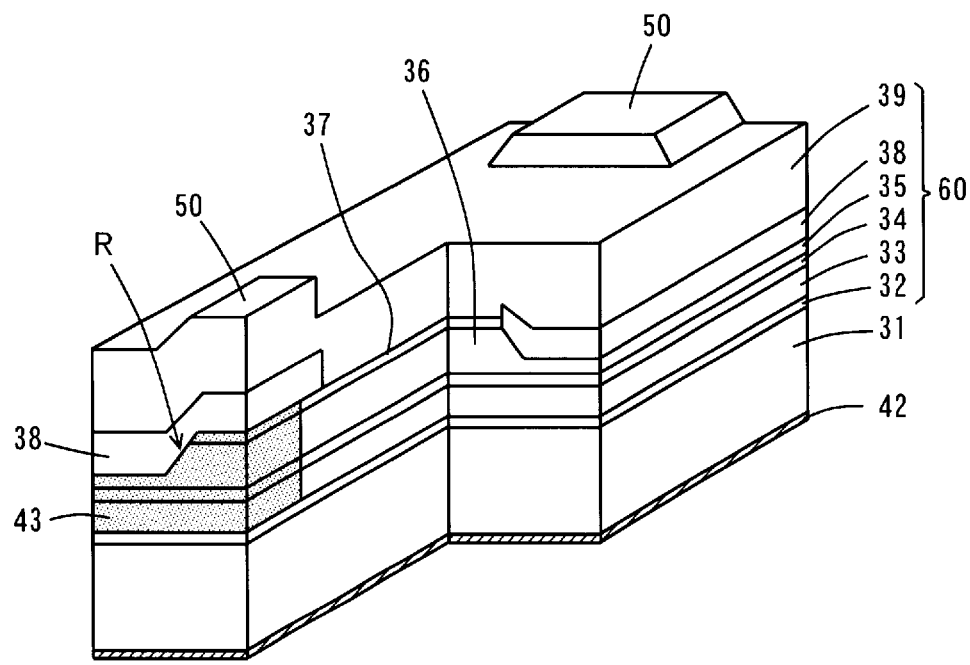
FIG. 11 is a partly cut away, perspective view of a conventional semiconductor laser device having a window structure.
Figure 12:
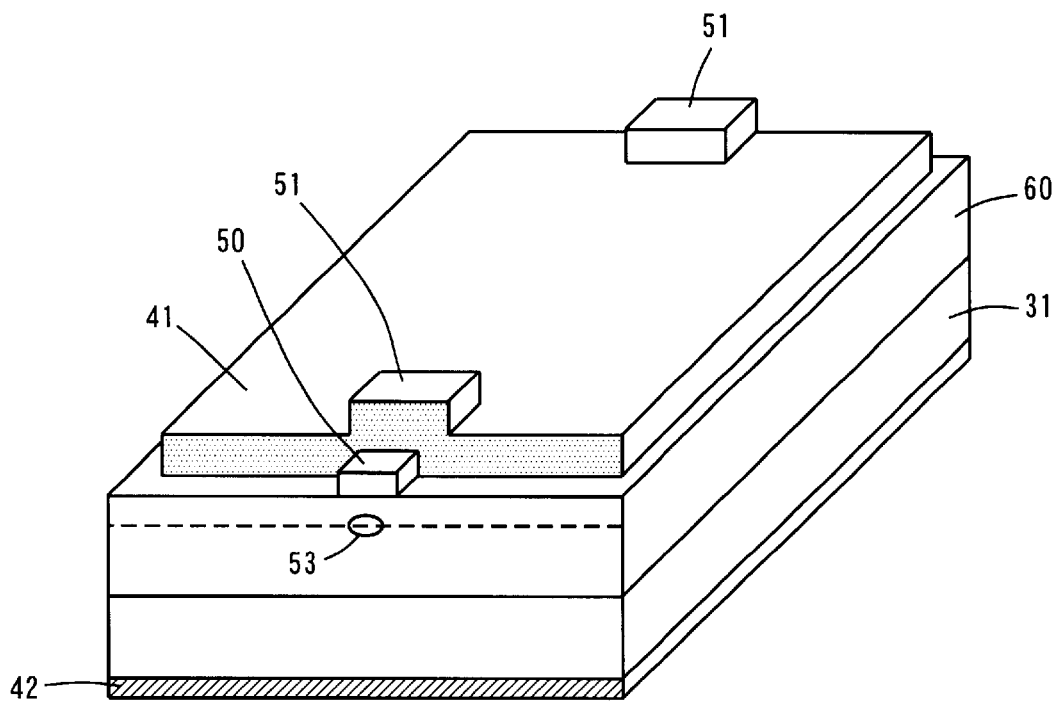
FIG. 12 is a schematic perspective overview of a conventional high power semiconductor laser device having the laser structure in FIG. 10 or 11.
Figure 13:
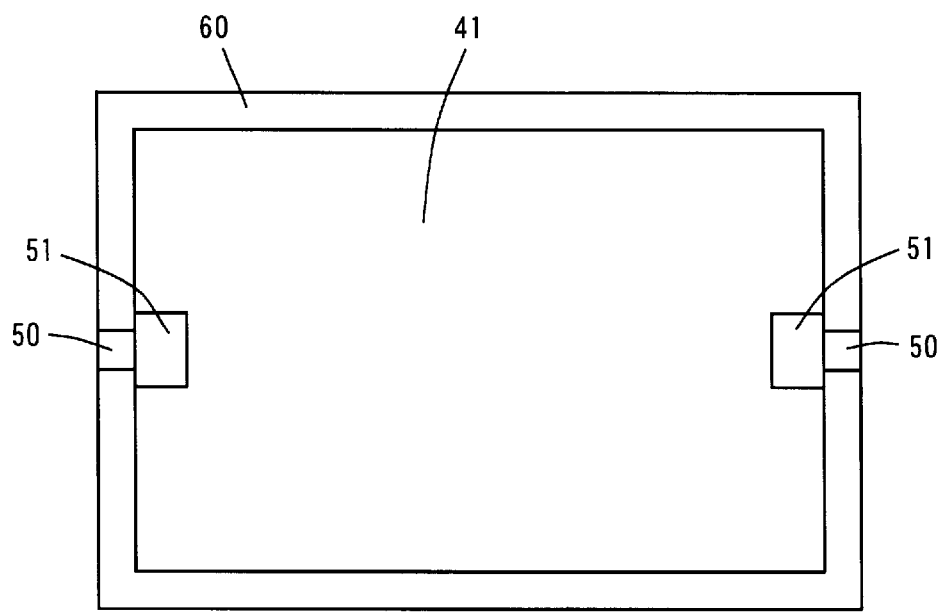
FIG. 13 is a schematic plan view of the semiconductor laser device in FIG. 12.
Figure 14:
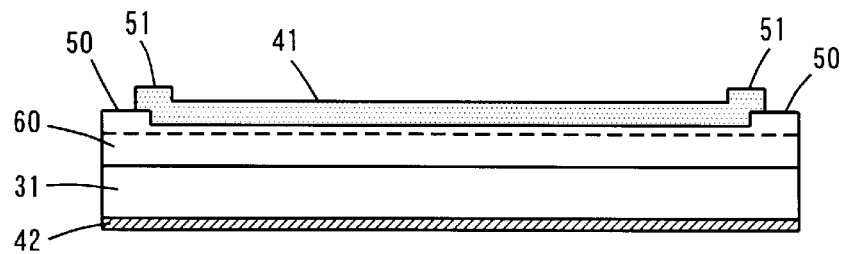
FIG. 14 is a schematic sectional view of the semiconductor laser device in FIG. 12 taken along the length of the cavity.
Figure 15:
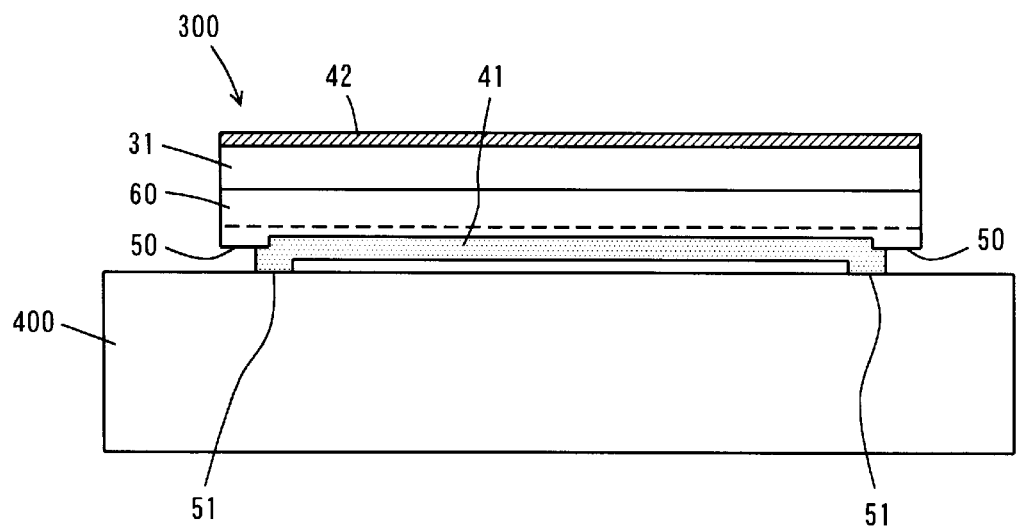
FIG. 15 is a schematic sectional view of the semiconductor laser device in FIG. 12 provided on a sub-mount taken along the length of a cavity.
Figure 16:
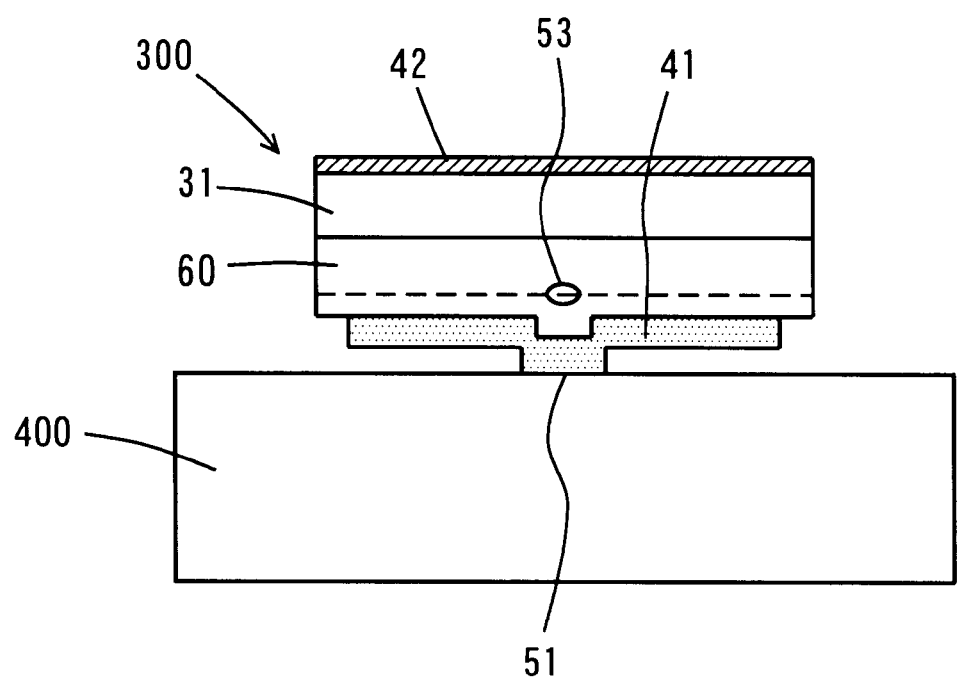
FIG. 16 is a schematic front view of the semiconductor laser device in FIG. 12 provided on a sub-mount.

FIG. 9 is a graph representing the result of the life test of the semiconductor laser devices according to the inventive example and the comparative example. In the life test, the semiconductor laser devices were operated in a pulsed condition. The pulse power was at 70 mW, and the ambient temperature was 60° C.

As shown in FIG. 9, the semiconductor laser device according to the comparative example had its operation current raised for a short period of time and failed, while the semiconductor laser device according to the inventive example stably operated for at least one thousand hours.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device, comprising:

a substrate;

a laser structure formed on said substrate and including an active layer forming a cavity; and an electrode layer formed on said laser structure, said laser structure having a raised portion on its upper surface, said electrode layer having a first film thickness of zero or more in a region on said raised portion and a second film thickness larger than said first film thickness in the region excluding said raised portion.

2. The semiconductor laser device according to claim 1, wherein said second film thickness is at least the sum of the height of said raised portion and the said first film thickness.

3. The semiconductor laser device according to claim 1, wherein said electrode layer includes:

a first electrode formed on the upper surface of said laser structure to cover at least a part of said raised portion; and a second electrode formed on said first electrode excluding a raised region formed in said first electrode because of said raised portion.

4. The semiconductor laser device according to claim 3, wherein, said first electrode and said second electrode are formed of the same material.

5. The semiconductor laser device according to claim 3, wherein, said first electrode and said second electrode are formed of different materials.

6. The semiconductor laser device according to claim 1, wherein, said laser structure comprises a cladding layer of a first conductivity type, an active layer, and a cladding layer of a second conductivity type in this order, said cladding layer of the second conductivity type has a flat portion, and a ridge portion formed in a striped region on said flat portion, said laser structure further comprises a current blocking layer of the first conductivity type formed on said flat portion on both sides of said ridge portion, on sides of said ridge portion and in a region on the upper surface of said ridge portion on the side of a facet of the cavity, and said raised portion is formed because of a part of said current blocking layer formed in the region on the upper surface of said ridge portion the facet side.

7. The semiconductor laser device according to claim 1, wherein said raised portion includes a pair of raised parts formed on the sides of both facets of the cavity.

8. The semiconductor laser device according to claim 1, wherein said active layer has a quantum well structure, and the region of said active layer on the side of a facet of the cavity has a band gap larger than in the other region of said active layer.

9. The semiconductor laser device according to claim 8, wherein the region of said active layer on the side of a facet of the cavity has a band gap larger than in the other region of said active layer because of impurity introduction.

10. The semiconductor laser device according to claim 1, wherein the region of said active layer on the side of a facet of the cavity has a band gap larger than in the other region of said active layer because of disordering of a natural super lattice structure.

11. The semiconductor laser device according to claim 1, further comprising a heat sink mounted on said electrode layer.

12. The semiconductor laser device according to claim 1, wherein said electrode layer has a first film thickness larger than zero in a region on said raised portion and a second film thickness larger than said first film thickness in the region excluding said raised portion.

13. The semiconductor laser device according to claim 1, wherein said electrode layer has a first film thickness of zero in the region on said raised portion and a second film thickness larger than zero in the region excluding said raised portion.

14. A method of manufacturing a semiconductor laser device, comprising the steps of:

forming on a substrate a laser structure including an active layer forming a cavity and a raised portion on an upper surface of said laser structure; and forming an electrode layer having a first film thickness of zero or more in a region on said raised portion and a second film thickness larger than said first film thickness in the region excluding said raised portion.

15. The method of manufacturing a semiconductor laser device according to claim 14, wherein said second film thickness is at least the sum of the height of said raised portion and said first film thickness.

16. The method of manufacturing a semiconductor laser device according to claim 14, wherein said step of forming the electrode layer comprises the steps of:

forming a first electrode to cover at least a part of said raised portion on the upper surf ace of said laser structure; and forming a second electrode on said first electrode excluding a raised region formed in said first electrode because of said raised portion.

17. The method of manufacturing a semiconductor laser device according to claim 14, wherein said step of forming the laser structure comprises the steps of:

forming a cladding layer of a first conductivity type, said active layer, and a cladding layer of a second conductivity type having a flat portion and a ridge portion formed in a striped region on said flat portion; and forming a current blocking layer of the first conductivity type on said flat portion on both sides of said ridge portion, on sides of said ridge portion, and in a region on the upper surface of said ridge portion on the side of a facet of the cavity, said raised portion being formed because of a part of said current blocking layer formed in the region on the upper surface of said ridge portion on the facet side.

18. The method of manufacturing a semiconductor laser device according to claim 14, further comprising the step of mounting a heat sink on said electrode layer.

19. The method of manufacturing a semiconductor laser device according to claim 14, wherein said raised portion includes a pair of raised parts formed on the sides of both facets of the cavity.

20. The method of manufacturing a semiconductor laser device according to claim 14, wherein said active layer has a quantum well structure, and the region of said active layer on the side of a facet of the cavity has a band gap larger than in the other region of said active layer.

\* \* \* \* \*